United States Patent
Lee et al.

(10) Patent No.: US 10,036,854 B2
(45) Date of Patent: Jul. 31, 2018

(54) DIGITAL ROLLER MOLD MANUFACTURING SYSTEM

(71) Applicant: National Cheng Kung University, Tainan (TW)

(72) Inventors: Yung-Chun Lee, Tainan (TW); Hung-Liang Chien, Tainan (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 264 days.

(21) Appl. No.: 14/964,276

(22) Filed: Dec. 9, 2015

(65) Prior Publication Data

US 2016/0349618 A1    Dec. 1, 2016

(30) Foreign Application Priority Data

May 29, 2015 (TW) .............................. 104117390 A

(51) Int. Cl.
| | |
|---|---|
| *G03F 7/20* | (2006.01) |
| *G02B 26/08* | (2006.01) |
| *G02B 6/32* | (2006.01) |
| *G03F 7/00* | (2006.01) |
| *G03F 7/24* | (2006.01) |

(52) U.S. Cl.
CPC ........... *G02B 6/32* (2013.01); *G02B 26/0833* (2013.01); *G03F 7/0017* (2013.01); *G03F 7/24* (2013.01)

(58) Field of Classification Search
CPC . G03F 7/0017; G03F 7/22; G03F 7/24; G03F 7/226; G03F 7/2055; G03F 2007/2067; G02B 6/0001; G02B 6/0005; G02B 6/0006; G02B 6/0013; G02B 6/0023; G02B 6/003; G02B 6/0033; G02B 6/005; B29C 33/38; B29C 33/3842; B29C 33/42; B29C 43/46; B29C 59/04; B29C 59/022
See application file for complete search history.

(56) References Cited

U.S. PATENT DOCUMENTS

| | | | | |
|---|---|---|---|---|
| 4,962,983 A | * | 10/1990 | Watanabe | G02B 26/10 250/578.1 |
| 9,329,484 B1 | * | 5/2016 | Markle | G03F 7/2051 |
| 2002/0180944 A1 | * | 12/2002 | Fujii | G03F 7/2053 355/70 |
| 2007/0224535 A1 | * | 9/2007 | Hoshi | G03F 7/2055 430/204 |

(Continued)

*Primary Examiner* — Alison L Hindenlang
*Assistant Examiner* — Mohamed K Ahmed Ali
(74) *Attorney, Agent, or Firm* — Chun-Ming Shih

(57) ABSTRACT

A digital roller mold manufacturing system for manufacture of exterior characteristic structures on a roller mold depends on an illuminator for generation and projection of a light source on a Digital Mirror Device (DMD) chip in which micro-mirrors are rotated a controllable angle for defining the light source as an optical image and projecting the optical image on first micro-lenses at which digital light energy is transformed from the optical image and transmitted to first optical fibers, second optical fibers via couplers, and second micro-lenses. Furthermore, the second micro-lenses focus the digital light energy as light spots which are received by a photo-resist layer externally covered on the roller for development of patterns with exterior characteristic structures on the roller mold because a control unit regulates rotations of the roller and horizontal shifts of second micro-lenses.

14 Claims, 5 Drawing Sheets

(56) References Cited

U.S. PATENT DOCUMENTS

| | | | |
|---|---|---|---|
| 2008/0113302 A1* | 5/2008 | Takashima | G03F 7/70275 430/322 |
| 2009/0046262 A1* | 2/2009 | Okazaki | G03F 7/70275 355/52 |
| 2016/0046045 A1* | 2/2016 | Matsumoto | G02B 27/0927 264/496 |
| 2016/0054216 A1* | 2/2016 | Sokol | G01N 19/04 73/800 |

* cited by examiner

DIGITAL ROLLER MOLD MANUFACTURING SYSTEM

BACKGROUND OF THE INVENTION

1. Field of the Invention

The present disclosure relates to a roller printing manufacturing technique, particularly a digital roller mold manufacturing system for manufacture of a roller mold on which some complex patterns or 3D micro-structures, seamless and large-sized, are imprinted.

2. Description of the Prior Art

Based on steps similar to ordinary printing, the roller printing manufacturing technique, which is intended to make large-sized exterior characteristic structures on a roller mold transferred to or reproduced on another substrate's surface continuously and quickly, has been widely applied in commodity industries such as high polymer, artificial leather, plastic material, ornament, building material, furniture, and daily necessities. Furthermore, the roller manufacturing technique has been introduced into the optoelectronic industry for touch panels, flat panel displays, optical templates, backlight modules, PCBs, and flexible solar panels in the wake of development of micron or nano technologies.

The available advanced facilities, materials and techniques, however, are still the core issues in developing a roller printing manufacturing technique with a special roller mold for complex patterns and 3D micro-structures, seamless and large-sized, when complicated patterns with miniature structures or 3D profiles and quality of end products based on roller printing techniques are required.

SUMMARY OF THE INVENTION

A digital roller mold manufacturing system in the present disclosure is intended to manufacture a special roller mold on which complex patterns or 3D micro-structures, seamless and large-sized, are imprinted without problems in conventional techniques.

For the above purposes, a digital roller mold manufacturing system comprises a projection module, a transformation module, a focusing module, a roller mold and a control unit: the projection module comprises an illuminator (UV-LED), a Digital Mirror Device (DMD) chip and an imaging lens; the transformation module comprises at least a first micro-lens and at least a first optical fiber; the transformation module comprises at least a first micro-lens and at least a first optical fiber; the focusing module comprises at least a second micro-lens and at least a second optical fiber.

The illuminator is used to generate a light source projected on the DMD chip at which an optical image is created; the optical image is projected on the imaging lens and further on the first micro-lenses from the imaging lens by a specific magnification; the light source is constant-wavelength UV light; the DMD chip consists of a plurality of micro-mirrors which are arranged as a matrix and rotated a controllable angle regulated by the control unit.

The optical image projected from the imaging lens is received by the first micro-lenses and transformed to digital light energy which is further transmitted to the first optical fibers. The first micro-lenses are aspheric micro-lenses arranged as a matrix; the first optical fibers are optical fibers arranged as a matrix; a first micro-lens matches a first optical fiber.

The digital light energy from the first optical fibers is received by the second optical fibers and transmitted to the second micro-lenses at which the digital light energy is focused as light spots. The second micro-lenses are a plurality of line-up aspheric micro-lenses; the second optical fibers are a plurality of line-up optical fibers; the second micro-lenses relative to the roller are arranged horizontally; a second micro-lens matches a second optical fiber.

The roller mold comprises a roller and a photo-resist layer at which light spots are received for development of patterns. The photo-resist layer is externally or internally covered on the roller; the roller completes rotations relative to the second micro-lenses.

The control unit electrically connected to the DMD chip, the second optical fibers and the roller is able to regulate a controllable angle of the micro-mirrors in the DMD chip, rotations of the roller and horizontal shifts of the second optical fibers relative to the roller.

DETAILED DESCRIPTION OF THE PREFERRED EMBODIMENT

A digital roller mold manufacturing system is described in the embodiments but the scope of appended claims should not be limited in the embodiments.

Figure 1:
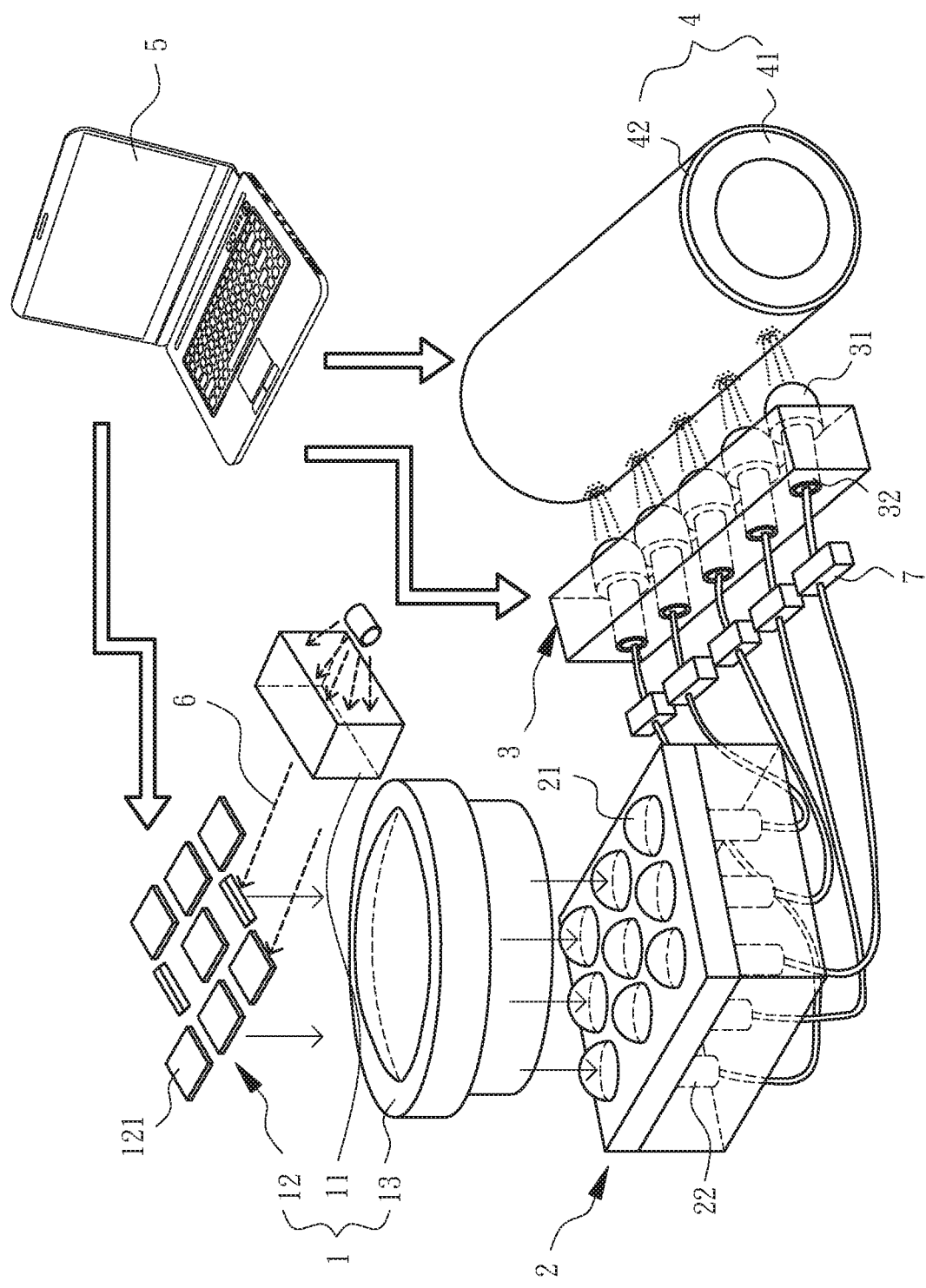
FIG. 1 illustrates system architecture of a digital roller mold manufacturing system.

Referring to FIG. 1 which illustrates a digital roller mold manufacturing system in an embodiment comprises a projection module 1, a transformation module 2, a focusing module 3, a roller mold 4 and a control unit 5. The projection module 1 comprises an illuminator 11, a Digital Mirror Device (DMD) chip 12 and an imaging lens 13: the illuminator 11 generates a light source 6 projecting constant-wavelength UV light, for example, a UV light source with a wavelength of 405 nm in the embodiment; the DMD chip 12 consists of a plurality of micro-mirrors 121 which are arranged as a matrix and rotated a controllable angle up to 45 degrees about the mirrors' shaft; the imaging lens 13 is an optical imaging lens for a short distance.

The transformation module 2 comprises at least a first micro-lens 21 and at least a first optical fiber 22. The first micro-lenses 21 are a plurality of aspheric micro-lenses arranged as a matrix; the first optical fibers 22 are a plurality of two-dimensional optical fibers arranged as a matrix; an aspheric micro-lens in the first micro-lenses 21 independently matches a single optical fiber in the matrix of first optical fibers 22. The focusing module 3 comprises at least a second micro-lens 31 and at least a second optical fiber 32: the second micro-lenses 31 are a plurality of line-up aspheric micro-lenses; the second optical fibers 32 are a plurality of line-up optical fibers; an aspheric micro-lens in the second micro-lenses 31 independently matches a single optical fiber in the second optical fibers 32; a second optical fiber 32 is connected to a first optical fiber 31 through a coupler 7.

The roller mold 4 comprises a roller 41 and a photo-resist layer 42 which is externally covered on the roller 41. The control unit 5 electrically connected to the DMD chip 12, the second optical fibers 32 and the roller 41 is used to regulate a controllable angle of the micro-mirrors 121 in the DMD chip 12, rotations of the roller 41 relative to the second micro-lenses 31 and horizontal shifts of the second micro-lenses 31 relative to the roller 41.

Figure 2:
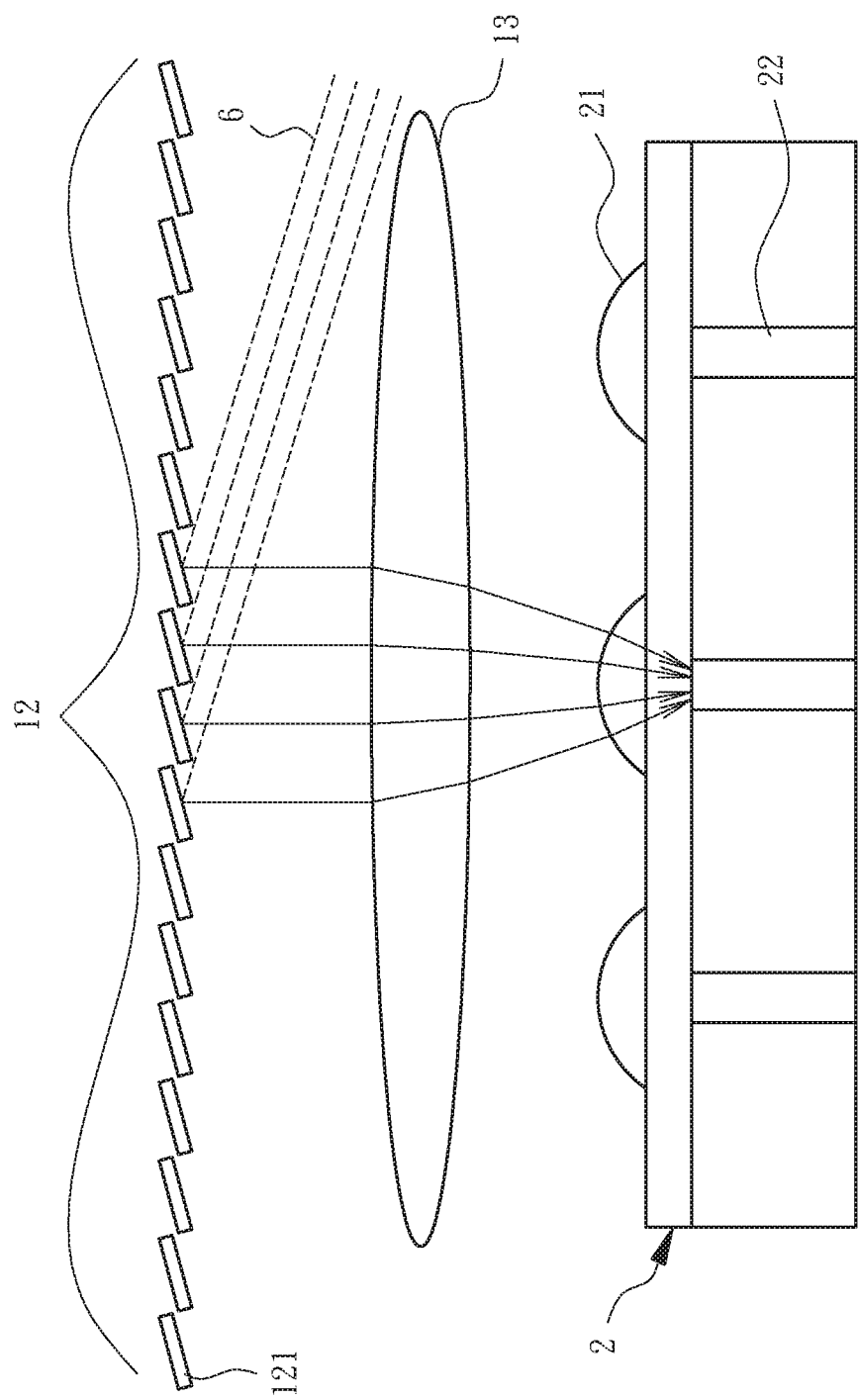
FIG. 2 is a schematic view illustrating a Digital Mirror Device chip, a two-dimensional optical fiber matrix and an aspheric micro-lens matrix in a digital roller mold manufacturing system.

Referring to FIGS. 1 and 2 which illustrate the illuminator 11 generates and projects the light source 6 on the DMD chip 12 according to images of exterior characteristic structures to be developed on the roller mold 4. The light source 6 defines an optical image (not shown in figures) based on ON-OFF instructions issued by the control unit 5 for regulating a controllable angle of the micro-mirrors 121 in the DMD chip 12. The optical image is projected on the imaging lens 13 and further on the first micro-lenses 21 from the imaging lens 13 by a specific magnification of 1:1 or 2:1. Through the first micro-lenses 21, the optical image is transformed to digital light energy (not shown in figures) that is further transmitted to the first optical fibers 22, the second optical fibers 32 via the coupler 7, and the second micro-lenses 31 at which the digital light energy is focused to light spots. Because the control unit 5 regulates rotations of the roller 41 relative to the second micro-lenses 31 and horizontal shifts of the transversely arranged second micro-lenses 31 relative to the roller 41, the light spots that were generated with the digital light energy focused by the second micro-lenses 31 are received by the photo-resist layer 42 externally covered on the roller 41 for development of exterior characteristic structures on the roller mold 4 by which micro-structures are printed on the roller mold 4 in an electroplating or etching process.

Figure 3:
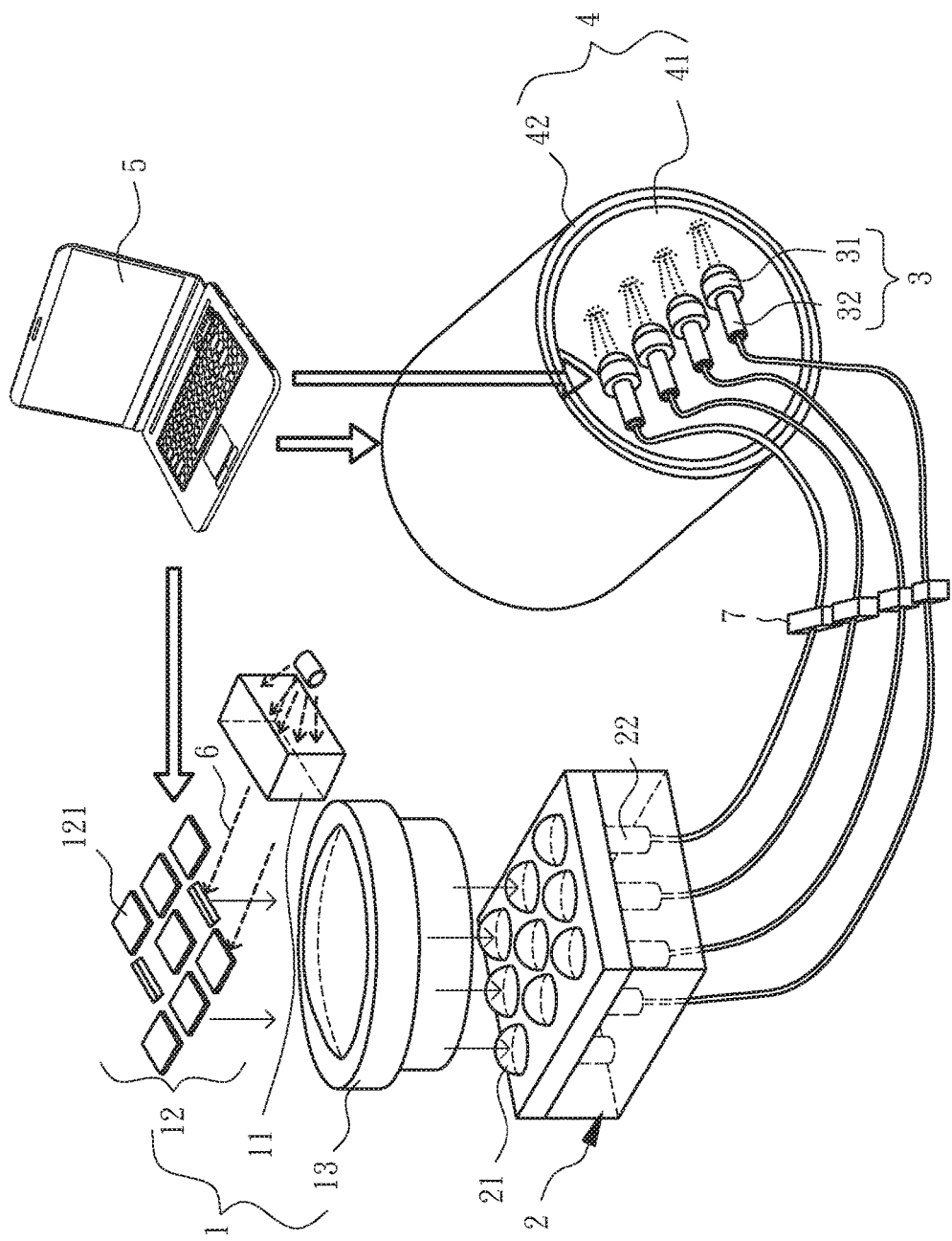
FIG. 3 illustrates system architecture of a digital roller mold manufacturing system in another embodiment.

Referring to FIG. 3 which illustrates a digital roller mold manufacturing system in another embodiment. The photo-resist layer 42 is internally covered on the roller 41 in which the second optical fibers 32 and the second micro-lenses 31 are installed. Similarly, light spots resulting from digital light energy focused by the second micro-lenses 31 are received by the photo-resist layer 42 inside the roller 41 for development of patterns with exterior characteristic structures on the roller mold 4 because the control unit 5 in the embodiment regulates rotations of the roller 41 relative to the second micro-lenses 31 and horizontal shifts of the second micro-lenses 31 relative to the roller 41. In the following process for manufacture on the roller mold 4, the photo-resist layer 42 which is taken as a template having undergone steps of exposure and development is electro-formed for manufacturing a cylindrical thin metal (e.g., nickel) mold on which patterns with expected exterior characteristic micro-structures for follow-up roller printing/imprinting steps are printed.

Figure 4:
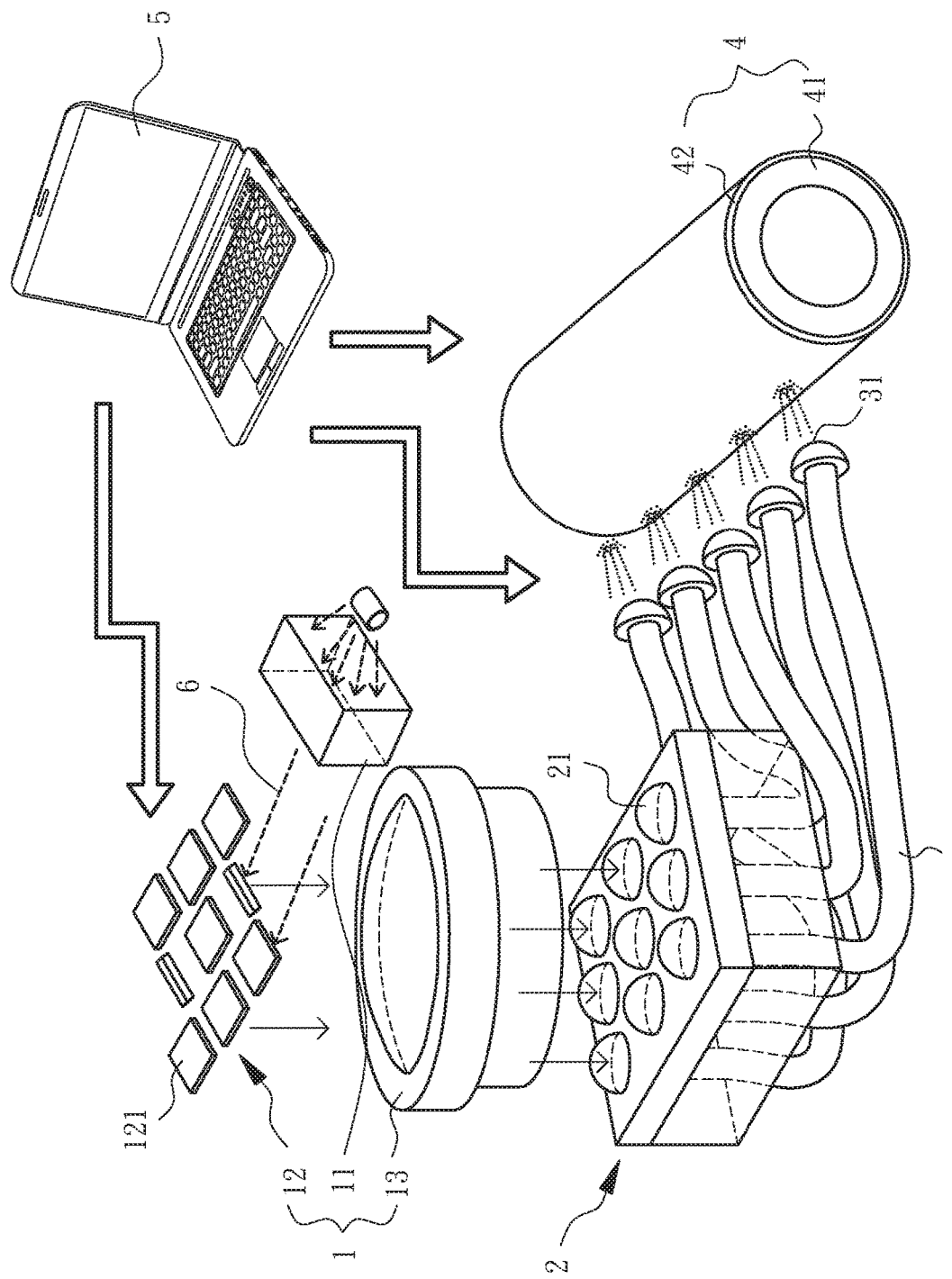
FIG. 4 illustrates system architecture of a digital roller mold manufacturing system in a further embodiment.

Referring to FIG. 4 which illustrates a digital roller mold manufacturing system in a further embodiment. Different from previous embodiments, an optical image projected on the imaging lens 13 is received by the first micro-lenses 21 in the transformation module 2 through which digital light energy is transformed from the optical image, transmitted to at least a third optical fiber 8 and further the second micro-lenses 31 in the focusing module 3, and finally focused as light spots by the second micro-lenses 31 without steps in the previous embodiments that digital light energy transformed by the first micro-lenses 21 is transmitted to the first optical fibers 22, the second optical fibers 32 and the second micro-lenses 31 in order and focused as light spots by the second micro-lenses 31.

Figure 5:
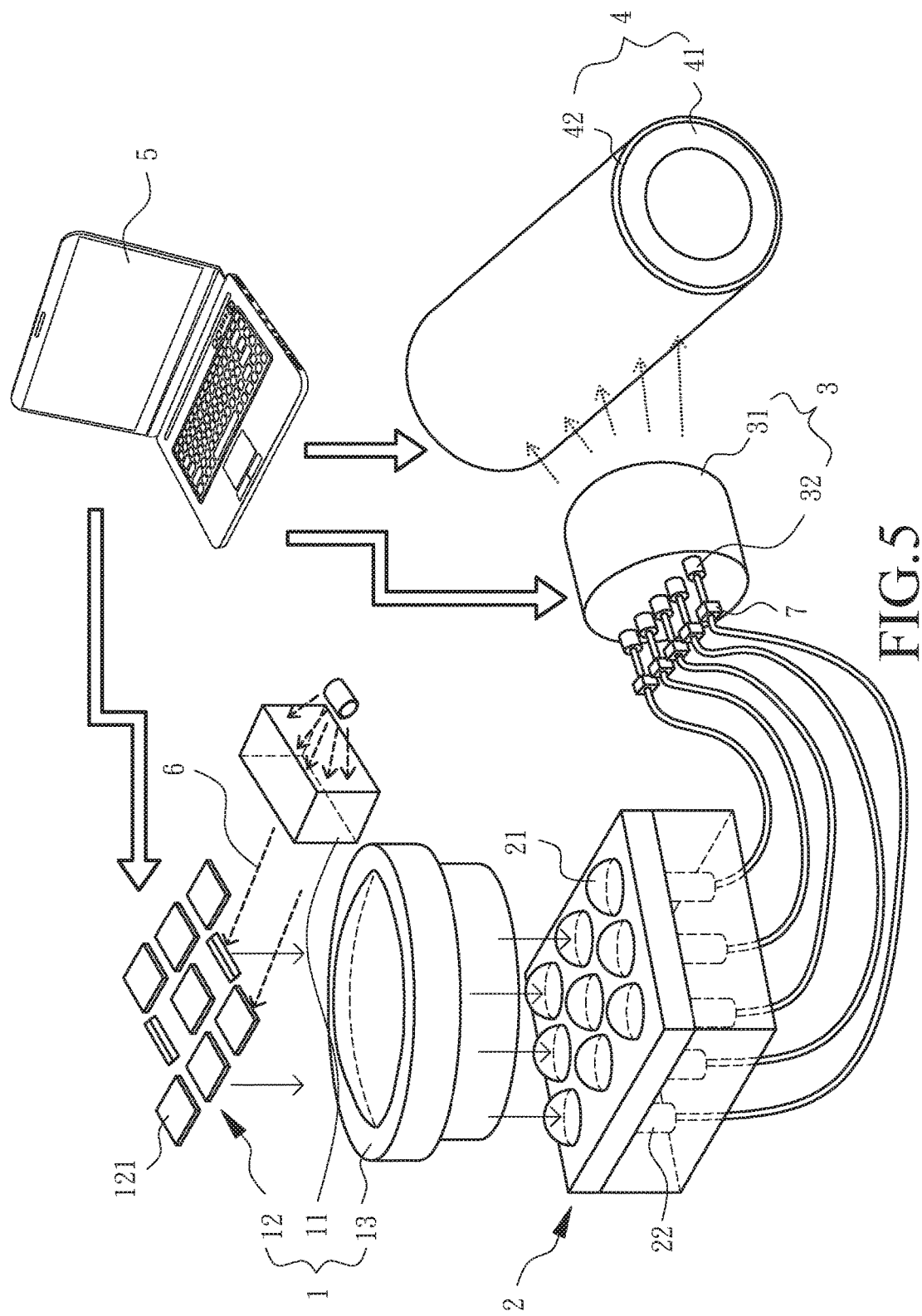
FIG. 5 illustrates system architecture of a digital roller mold manufacturing system in a yet another embodiment.

Referring to FIG. 5 which illustrates a digital roller mold manufacturing system in yet another embodiment in which the second micro-lens 31 is a single aspheric micro-lens. In the embodiment, digital light energy from a plurality of fibers arranged as a matrix in the first optical fibers 22 is received by a plurality of line-up optical fibers in the second optical fibers 32 and transmitted to the second micro-lenses 31 at which light spots, through focusing the digital light energy, are projected on the roller mold 4 and received by the photo-resist layer 42 externally covered on the roller 41 for development of patterns with characteristic structures on the roller mold 4.

As mentioned previously, a digital roller mold manufacturing system in the present disclosure has following features and effects in contrast to conventional roller mold manufacturing techniques:

1. Simple and fast manufacture: A digital roller mold manufacturing system in the present disclosure, which incorporates conventional manufacturing steps into a single manufacturing system without redundant steps, is able to complete manufacture of micro-structures on a roller mold through digital signal processing in a control unit quickly.
2. High precision and greater size: A digital roller mold manufacturing system in the present disclosure for manufacture of micro-structures on a roller mold directly is characteristic of good scalability and non-obviousness for a roller's greater diameter or length, for example, the horizontal linear shift of second micro-lenses can be increased for a longer roller or wider UV-based patterns, without drawbacks of conventional techniques based on a roller mold which is subject to the size of a glass mask for completion of micro-structures on a roller mold in splicing.
3. Seamless integrated roller mold: A seamless roller mold, particularly a roller mold with a planar nickel mold covered on a roller, cannot be manufactured in conventional techniques which are short of good mechanical stability and precision of patterns to be matched and defective in a nickel mold shifted easily or caught in troubles such as gap, notch, dent, and bulge at a seam degrading the level of a roller mold's surface or worsening imprinting steps. In contrast, a digital roller mold manufacturing system in the present disclosure which features micro-structures manufactured on a roller directly is successful in seamless patterns and the level of a roller mold's surface.

In summary, a digital roller mold manufacturing system in the patent application is innovative work in technical ideas and meets novelty and non-obviousness for patentability.

What is claimed is:

1. A digital roller mold manufacturing system, comprising:
  a projection module comprising:
    an illuminator provided for generating a light source;
    a Digital Mirror Device (DMD) chip consisting of a plurality of micro-mirrors provided for the light source being projected thereon from the illuminator to create an optical image; and
    an imaging lens provided for the optical image being projected thereon from the DMD chip;
  a transformation module comprising:
    a plurality of first micro-lenses provided for receiving the optical image from the imaging lens to create digital light energy; and
    a plurality of first optical fibers correspondingly connected to the first micro-lenses for receiving the digital light energy from the first micro-lenses;

a focusing module comprising:
  a plurality of second optical fibers correspondingly connected to the first optical fibers for receiving the digital light energy from the first optical fibers; and
  a plurality of second micro-lenses correspondingly connected to the second optical fibers for receiving the digital light energy from the second optical fibers to focus the digital light energy to a plurality of light spots; and
a roller mold comprising:
  a roller formed in a tube shape; and
  a photo-resist layer positioned on an outer surface or an inner surface of the tube shape for receiving the light spots.

2. A digital roller mold manufacturing system according to claim 1 wherein the light source is constant-wavelength UV light.

3. A digital roller mold manufacturing system according to claim 1 wherein the micro-mirrors are controlled by a control unit for rotating at a controllable angle.

4. A digital roller mold manufacturing system according to claim 1 wherein the imaging lens is an optical imaging lens for a short distance for projecting the optical image on the first micro-lenses by a specific magnification.

5. A digital roller mold manufacturing system according to claim 1 wherein the first micro-lenses are aspheric micro-lenses arranged as a 2-dimension matrix, the first optical fibers are arranged as a 2-dimension matrix, the second optical fibers are linearly arranged, and the second micro-lenses are linearly arranged.

6. A digital roller mold manufacturing system according to claim 1 wherein the photo-resist layer is positioned on the outer surface of the tube shape.

7. A digital roller mold manufacturing system according to claim 1 wherein the photo-resist layer is positioned on the inner surface of the tube shape.

8. A digital roller mold manufacturing system according to claim 6 wherein the second micro-lenses are positioned perpendicular to the roller.

9. A digital roller mold manufacturing system according to claim 6 wherein the roller is controlled by the control unit for rotating.

10. A digital roller mold manufacturing system according to claim 1 wherein the second micro-lenses are controlled by the control unit for horizontally shifting relative to the roller.

11. A digital roller mold manufacturing system according to claim 1 wherein the first optical fibers are correspondingly connected to the second optical fibers via a coupler.

12. A digital roller mold manufacturing system, comprising:
a projection module comprising:
  an illuminator provided for generating a light source;
  a Digital Mirror Device (DMD) chip consisting of multiple micro-mirrors provided for the light source being projected thereon from the illuminator to create an optical image; and
  an imaging lens provided for the optical image being projected thereon from the DMD chip;
a transformation module comprising:
  a plurality of first micro-lenses provided for receiving the optical image from the imaging lens to create digital light energy; and
  a plurality of optical fibers correspondingly connected to the first micro-lenses for receiving the digital light energy from the first micro-lenses;
a focusing module comprising:
  a plurality of second micro-lenses correspondingly connected to the optical fibers for receiving the digital light energy from the optical fibers to focus the digital light energy to a plurality of light spots; and
a roller mold comprising:
  a roller formed in a tube shape; and
  a photo-resist layer positioned on an outer surface or an inner surface of the tube shape for receiving the light spots.

13. A digital roller mold manufacturing system according to claim 7 wherein the second micro-lenses are positioned perpendicular to the roller.

14. A digital roller mold manufacturing system according to claim 7 wherein the roller is controlled by the control unit for rotating.

* * * * *